United States Patent [19]
Wang

[11] Patent Number: 6,054,394
[45] Date of Patent: Apr. 25, 2000

[54] METHOD OF FABRICATING A DYNAMIC RANDOM ACCESS MEMORY CAPACITOR

[75] Inventor: Chuan-Fu Wang, Taipei Hsien, Taiwan

[73] Assignee: United Microelectronics Corp., Hsinchu, Taiwan

[21] Appl. No.: 09/200,243

[22] Filed: Nov. 25, 1998

[51] Int. Cl.[7] .................................................. H01L 21/00
[52] U.S. Cl. ........................ 438/753; 438/738; 438/740; 438/757
[58] Field of Search .................................. 216/6, 99, 109; 438/735, 738, 740, 742, 743, 744, 753, 754, 755, 757

[56] References Cited

U.S. PATENT DOCUMENTS

5,990,021  11/1999  Prall et al. .......................... 438/753 X

*Primary Examiner*—William Powell
*Attorney, Agent, or Firm*—Hickman Stephens Coleman & Hughes, LLP

[57] ABSTRACT

A fabricating method for a dynamic random access memory capacitor includes the following steps. A cap layer and a spacer are formed on the gate to protect the gate from being etched. A self-aligned contact hole is formed and then the self-aligned contact hole is etched again to form a contact node opening. In this way, the difficulty of forming the contact node opening can be reduced. The method of forming the storage electrode includes forming and patterning a stacked layer, which is formed by several conductive layers and isolation layers interlaced with each other, to form the self-aligned contact hole. A conductive spacer is formed on the sidewall of the stacked layer. The conductive spacer is used as a mask to etch the dielectric layer below the bit line so as to form a contact node opening. The contact opening exposes a source/drain region. A conductive layer is formed to fill the contact node opening. The conductive layer and the staked layer are patterned. The isolation layer of the stacked layer is removed to expose the storage electrode formed by the conductive layers and the conductive layer.

23 Claims, 6 Drawing Sheets

METHOD OF FABRICATING A DYNAMIC RANDOM ACCESS MEMORY CAPACITOR

BACKGROUND OF THE INVENTION

1. Field of the Invention

The present invention relates to a semiconductor fabricating method. More particularly, the present invention relates to a method of fabricating a capacitor.

2. Description of the Related Art

Figure 1:
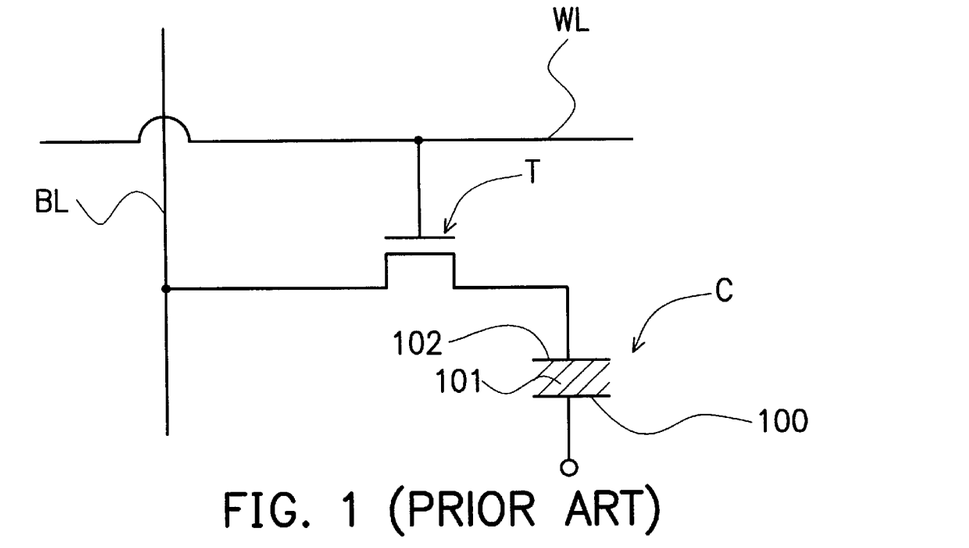
FIG. 1 is a circuit diagram of a dynamic random memory cell (DRAM) memory cell.

As the function of a microprocessor becomes more powerful, the program and calculation of software becomes more complicated, and thus the need for Dynamic Random Access Memory (DRAM) storage memory is increased. As the number of semiconductor devices incorporated in integrated circuit increases, a memory cell, which comprises a transfer field effect transistor (TFET) and a storage capacitor, is widely used. FIG. 1 is a circuit diagram of a DRAM memory cell. A capacitor C selected from an array of capacitors is used to store information as binary data by charging/discharging the capacitor C. Normally, a binary bit is stored in each capacitor, and when the capacitor C is free of charge, logic "0" is represented, whereas when the capacitor is fully charged, logic "1" is represented. In general, a dielectric film 101 is deposited between a top electrode (cell electrode) 102 and a bottom electrode (storage electrode) 100. The capacitor C is electrically coupled with a bit line BL. The read/write operation of the DRAM memory cell is performed by charging/discharging the capacitor C. The bit line BL is connected to the drain of a transfer field effect transistor T. The capacitor C is connected to the source of the transfer field effect transistor T. A signal is transmitted through a gate of the transfer field effect transistor T, which is used to control the capacitor C by turning on or off the connection with the bit line BL. In other words, the transfer field effect transistor T acts as a switch to control the charging and discharging of the capacitor C.

A capacitor is the heart of the DRAM memory cell. As the storage capacitor pf capacitor increases, the noise effect occurring when reading the data by amplifiers is decreased. There are three methods for increasing the storage capacity of a capacitor. The first method is to use a material with a high dielectric constant. The second method is to reduce the thickness of the dielectric layer. The third method is to increase the surface area of the capacitor. For a highly integrated DRAM, a three-dimensional capacitor, such as a stacked-type or a trench-type capacitor, has been introduced. However, to realize a semiconductor device of an even higher degree of integration, such a DRAM having a storage capacity of 64M bits, a capacitor of such a simple three-dimensional structure as the conventional stacked-type or trench-type turns out to be insufficient. One solution for improving the capacitance of a capacitor is to use a fin-type stacked capacitor. The fin-type stacked capacitor includes electrodes and dielectric layers which extend with a fin shape in a plurality of stacked layers. Another solution for improving the capacitance of a capacitor is to use a cylindrical-type stacked capacitor. The cylindrical-type stacked capacitor includes electrodes and dielectric films which extend in a cylindrical shape to increase the surface areas of the electrodes.

Figure 2:
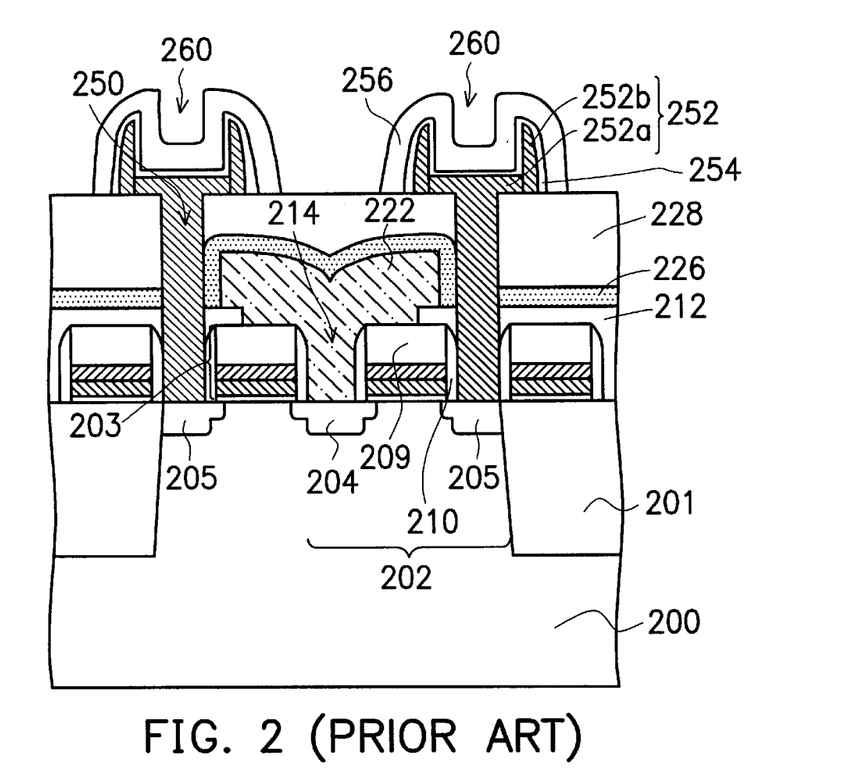
FIG. 2 is a schematic, cross-sectional view showing a conventional DRAM cylindrical capacitor fabricating process.

FIG. 2 is a schematic, cross-sectional view showing a conventional DRAM cylindrical capacitor fabricating process.

In FIG. 2, a substrate 200 having isolation 201 therein is provided. The isolation 201 is used to define an active region. A field effect transistor 202 is formed on the substrate 200. The field effect transistor 202 includes a gate 203 and source/drain regions 204 and 205. The gate 203 includes a cap layer 209. A spacer 210 is formed on the sidewalls of the gate 209. A bit line 222 is electrically coupled with the source/drain region 204. The steps of forming the bit line 222 include forming a dielectric layer 212 over the substrate 200. A conventional photolithography process is performed to form a self-aligned contact hole 214. A conductive layer (not shown) is formed on the self-aligned contact hole 214 and then the conductive layer is patterned. The bit line 222 thus is completed.

A method of forming a DRAM capacitor 260 and a storage node 250 is described by the following steps. A silicon oxide layer 226 is formed over the substrate 200. A phosphate silicon glass (BPSG) layer 228 is formed on the silicon oxide layer 226 to provide a planarized surface. The BPSG layer and the silicon oxide layer 226 are patterned to form a contact hole 250 therein. A doped polysilicon layer 252a and a BPSG layer 228 are formed in sequence on the substrate 200. A doped polysilicon layer (not shown) is formed on the substrate 200. A etch back step is performed. A spacer 252b made from doped polysilicon layer is formed. The BPSG layer (not shown) is removed to expose a cylindrical electrode 252 formed by the doped polysilicon layers 252a and 252b. A dielectric layer 254 and a conductive layer 256 are formed in sequence over the substrate 200. A DRAM capacitor 260 is completed.

However, as the linewidth of the semiconductor process is reduced, misalignment often occurs during the step of forming a contact hole 250 by patterning the BPSG layer 228 and the silicon oxide 226. The misalignment makes precision in the photolithography process difficult to attain. Once the misalignment occurs, a shift in position of the contact hole 250 results. The bit line 222 thus is etched when performing the etching step. Hence, a short occurs from bit line 222 during the following step of forming the doped polysilicon layer 252b in the contact hole 250.

In other words, the cylindrical capacitor 260 and the storage node 252 described above increase the storage ability but difficulty is still encountered when trying to increase the storage ability while decreasing the component area occupied in a plane.

SUMMARY OF THE INVENTION

One aspect of the invention is to provide a fabricating method for a bit line suitable to integrated DRAM devices. The present invention prevents the bit line from being etched during the step of etching the dielectric layers to form a contact hole.

Another aspect of the invention is to provide a fabricating method for a DRAM capacitor. In the present invention, the effective area and capacitance of a capacitor is increased in a decreased area occupied in a plane.

Accordingly, the present invention provides a method of fabricating a capacitor. The present invention of forming a bit line comprises the steps of forming a dielectric layer on a substrate having a transistor thereon and patterning the dielectric layer to expose a source/drain region of the transistor. A self-aligned contact hole is formed. A conductive layer and an isolation layer are formed over the substrate and are patterned. A bit line having a cap layer thereon is formed. A silicon-rich oxide layer is formed over the substrate and the silicon-rich oxide is etched back. A spacer is formed on the sidewall of the bit line. The spacer prevents the bit line from being etched in the following process of forming a self-aligned contact hole for the capacitor. A storage electrode is formed by first forming a first dielectric layer on the substrate, then forming a second dielectric layer on the first dielectric layer to provide a planarized surface, and next forming an etching stop layer and a stacked layer over the substrate. The stacked layer is formed by several conductive layer and isolation layers interlaced with each other. The stacked layer, the etching stop layer, and the second dielectric layer are patterned to form a self-aligned contact hole over the source/drain region. A conductive spacer is formed on the sidewall of the self-aligned contact hole. The spacer and the top conductive layer of the stacked layer are used as masks to remove a portion of the first dielectric layer. A contact node opening exposing the source/drain region is formed. A conductive layer is formed over the substrate and fills the contact node opening. The conductive layer is electrically coupled with the source/drain region. The etching stop layer is used as an etching stop point in a process wherein the conductive layer and the stacked layer are pattered to expose a storage node formed by the conductive layer and the conductive layers of the stacked layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3H are schematic, cross-sectional views showing a DRAM capacitor fabricating process according to one preferred embodiment of the invention.

Figure 3A:
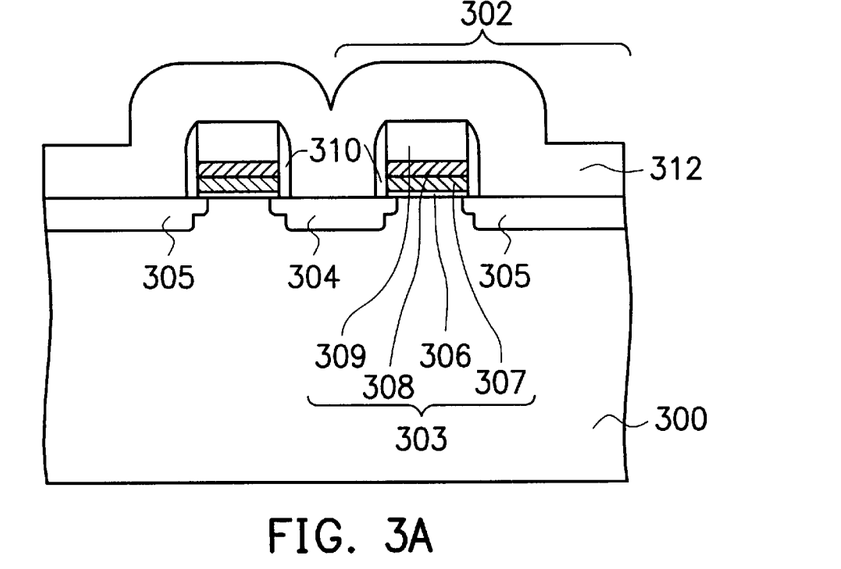
FIGS. 3A through 3H are schematic, cross-sectional views showing a DRAM capacitor fabricating process according to one preferred embodiment of the invention.

In FIG. 3A, a substrate 300, such as a P-type silicon substrate, is provided. An isolation structure is provided to define an active region. A DRAM field effect transistor 302 is formed on the active region. A dielectric layer 312 is formed on the substrate 300 and the field effect transistor 302. The field effect transistor 302 includes a gate 303 and source/drain regions 304 and 305. The gate 303 includes a gate oxide layer 306, a doped polysilicon layer 307, a metallic silicon layer 308, and a cap layer 309. The thickness of different layers may vary depending on the requirements, preferably, the thickness of the gate oxide layer 316 is about 100 Å. Preferably, the thickness of the doped polysilicon layer is about 1000 Å. The metallic silicon layer 308 can be $WSi_2$ with a preferred thickness of about 1000 Å. The cap layer 309 can be silicon nitride ($SiN_x$) with a preferred thickness of about 1000 Å. A spacer 310 is formed on the sidewall of a gate 303. The material of the gate 303 can be silicon nitride, for example. In one embodiment, the steps of forming the spacer 310 include, for example, forming a silicon nitride layer with a thickness of about 1500 Å on the substrate 300 and performing a etch back step. The dielectric layer 312 can be silicon oxide having a thickness of 1000 Å to 2000 Å formed by a chemical vapor deposition (CVD) method, for example.

Figure 3B:
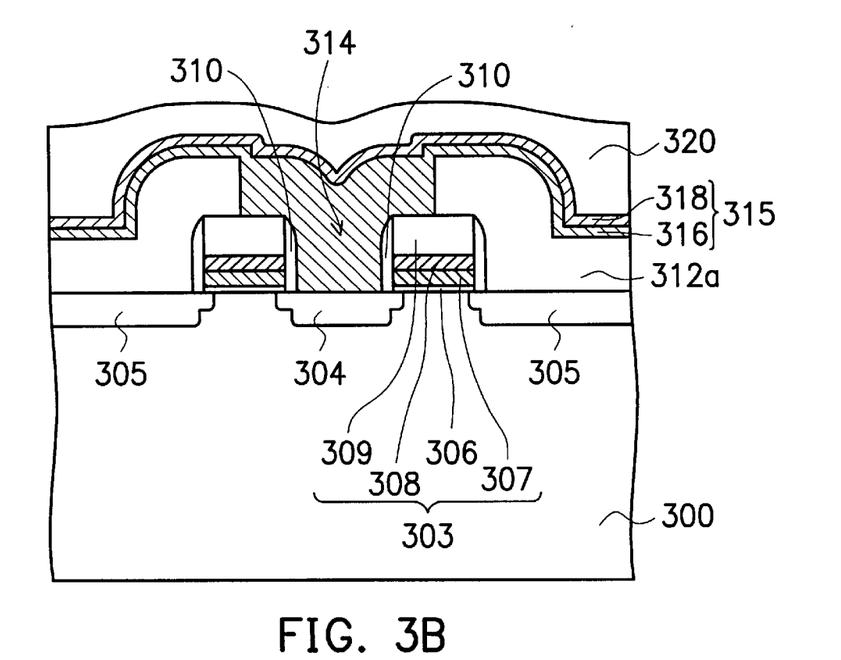

In FIG. 3B, the dielectric layer 312 is patterned to form a dielectric layer 312a. A self-aligned contact hole 314 is formed in the dielectric layer 312a. The self-aligned contact hole 314 exposes the source/drain region 304 and a portion of the gate 303. A conductive layer 315 is formed over the substrate 300. The conductive layer 315 fills the self-aligned contact hole 314 and is electrically coupled with the source/drain region 304. A cap layer 320 is formed over the substrate 300. The conductive layer 315 includes a doped polysilicon layer 316 and a metallic silicon layer 318 formed on the doped polysilicon layer 316. The method of forming a doped polysilicon layer, which has a thickness of about 1000 Å in one embodiment, can be low-pressure chemical vapor deposition, for example. The material of the silicide layer 318 includes tungsten silicon, cobalt silicon, and titanium silicon with a preferred thickness of about 1000 Å. The material of the cap layer 320 can be a silicon-rich oxide (SRO) layer, which has a thickness of about 2000 Å in one example, formed by chemical vapor deposition.

Figure 3C:
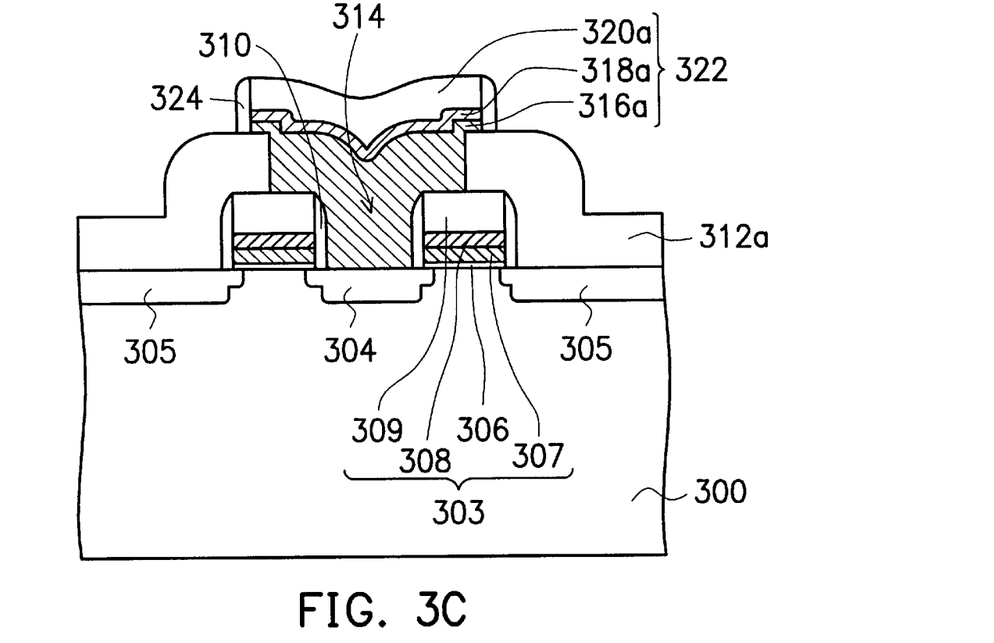

In FIG. 3C, the cap layer 320, the silicide layer 318, and the doped polysilicon layer 316 are patterned to from a cap layer 320a, a silicide layer 318a, and a doped polysilicon layer 316a. The combination of the cap layer 320a, the silicide layer 318a, and the doped polysilicon layer 316a forms a bit line 322. A spacer 324 is formed on the sidewalls of the bit line 322. The material of the spacer 324 includes silicon-rich oxide. The method of forming the spacer 324 includes forming silicon-rich oxide having a preferred thickness of about 1500 Å on the substrate 300 and performing an anisotropic etching process, for example. The present invention involves the formation of cap layer 320a on the bit line 322 and the spacer 324 on the sidewall of the bit line 322, which can protect the bit line 322 from being etched in the following steps and avoid the misalignment problems caused by the increasing integration density, as well.

Figure 3D:
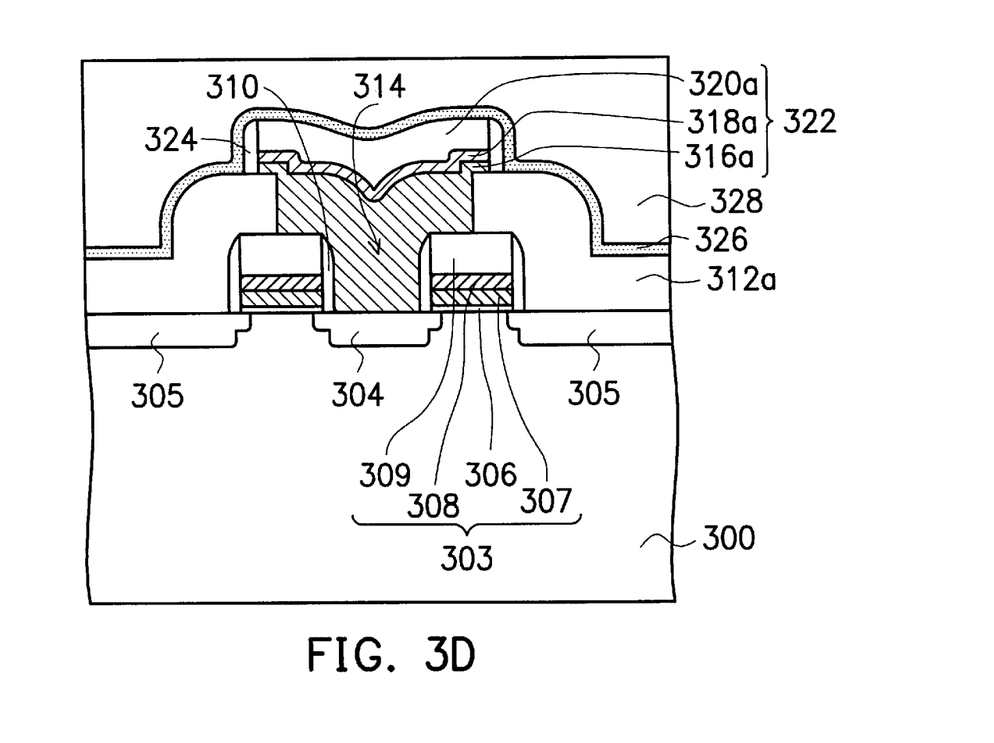

In FIG. 3D, a dielectric layer 326 is formed on the substrate 300. The material of the dielectric layer 326 can be silicon oxide, for example. Preferably, the dielectric layer 326 has a thickness of about 2000 Å, which can be formed by atmospheric pressure chemical vapor deposition. A dielectric layer 328 is formed on the dielectric layer 326 to provide a planarized surface. The dielectric layer 328, such as a BPSG layer, provides a planarized surface. For example, the method of forming the dielectric layer 328 includes performing a chemical vapor deposition process to deposit a BPSG layer with a thickness of about 7500 Å and performing a thermal flow process at a temperature of about 800° C. An etch back step is performed to removed a portion of the BPSG layer with a thickness about 5000 Å to form the dielectric layer 328.

Figure 3E:
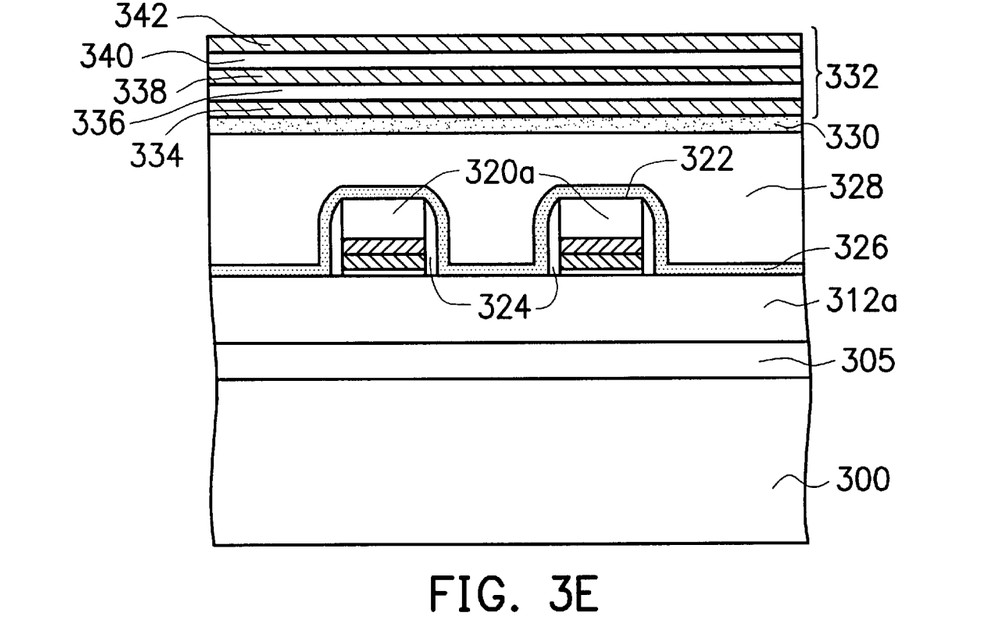
Figure 3F:
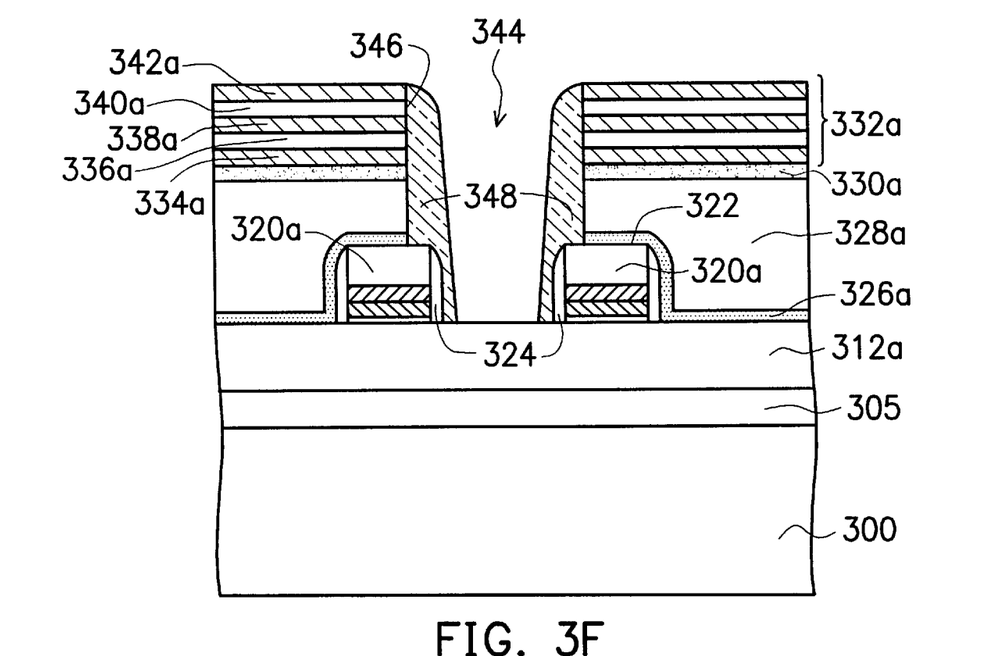
Figure 3G:
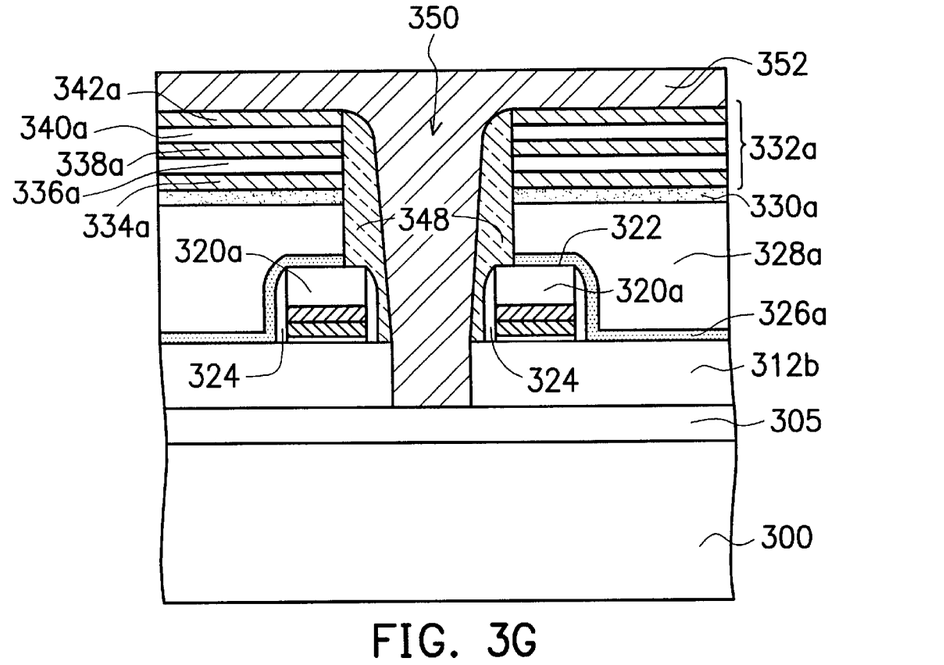
Figure 3H:
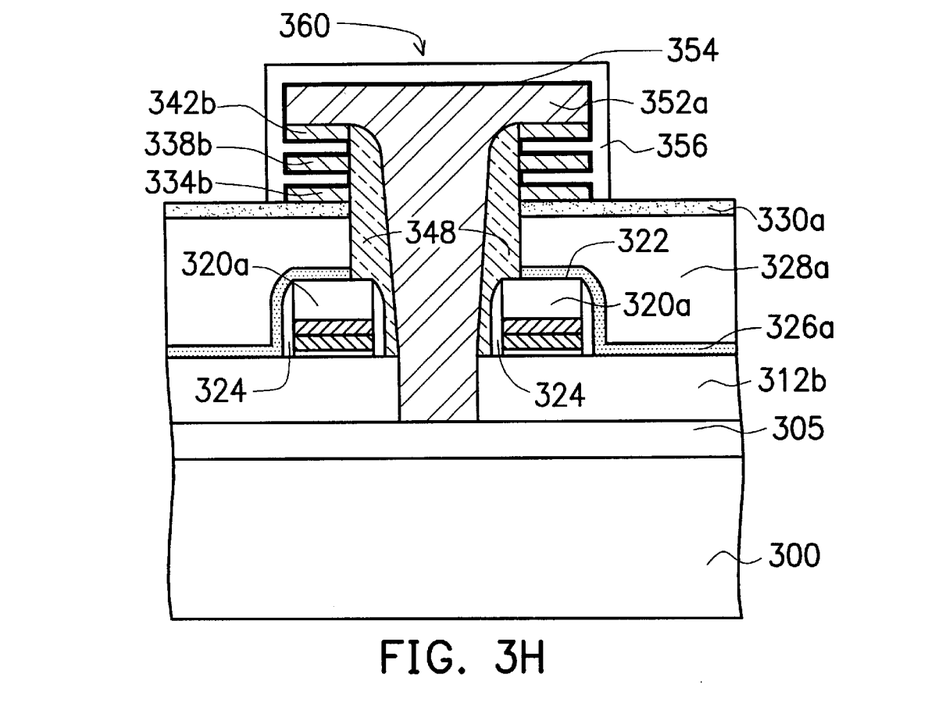
Figure 4A:
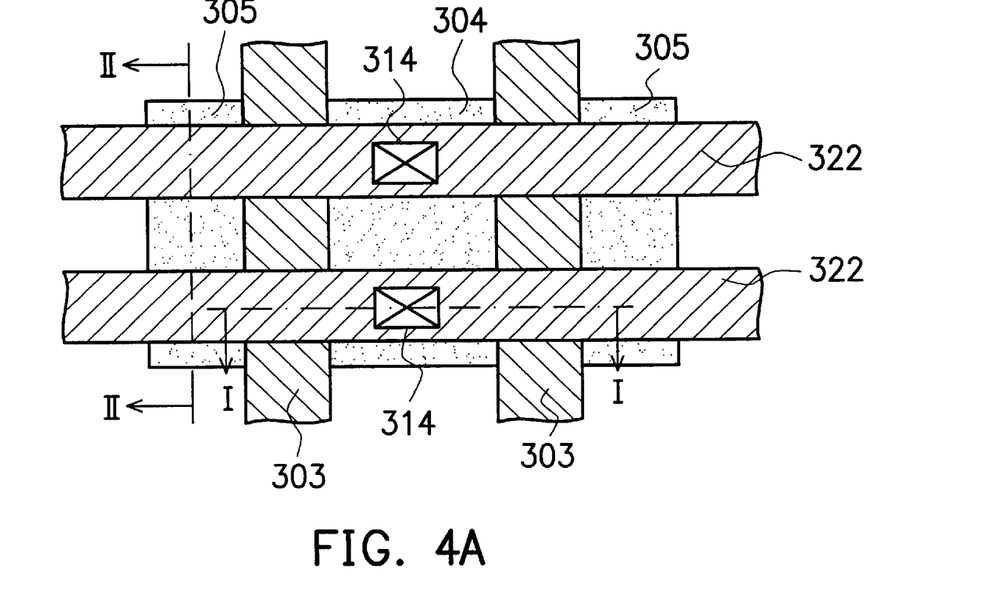
FIG. 4A is a top-view showing a DRAM layout of the FIGS. 3A through 3D.

FIG. 4A is a top-view showing a layout for the DRAM described in FIGS. 3A through 3D. FIGS. 3A through 3D are schematic, cross-sectional views of FIG. 4 taken along line I—I'. The self-aligned contact hole 314 between the gates 303 electrically couples the bit line 322 to the source/drain region 304. In the following steps, FIGS. 3E through 3H are schematic, cross-sectional views of a DRAM capacitor taken along line II—II' of FIG. 4A. FIGS. 3E through 3G are shown in order to describe the present invention clearly.

In FIG. 3E, an etching stop layer 330 and stacked layer 332 are formed in sequence over the substrate 300. The etching stop layer 330 with a preferred thickness of about 100 Å can be silicon nitride layer formed by low-pressure chemical vapor deposition, for example. The stacked layer 332 is formed from alternately arranged several conductive layers and the isolation layers. For example, the stacked layer 332 is formed by conductive layers 334, 338, and 342 and isolation layers 226, and 340 as shown. The method of forming the stacked layer 332 can be chemical vapor deposition method. The etching rates of the isolation layers 336 and 340, the conductive layers 334, 338, and 342, the etching stop layer 330 are different. The isolation layer 330 can be a silicon nitride layer formed by using chemical vapor deposition, for example.

In FIG. 3F, the stacked layer 332, the etching stop layer 330, the dielectric layer 328, and the dielectric layer 326 are patterned to form a self-aligned contact hole 344 resulting in a stacked layer 332a, an etching stop layer 330a, a dielectric layer 328a, and a dielectric layer 326a. The self-aligned contact hole 344 exposes the source/drain region 305. A conductive spacer 348 is formed on the sidewall of the self-aligned contact hole 344. The material of the conductive spacer 348 can be doped polysilicon, for example. The method of forming the conductive spacer 348 includes the step of forming a conductive layer (not shown) on the substrate 300 by chemical vapor deposition. An etching back step is performed to form a conductive spacer 348 on the sidewall of the self-aligned contact hole 344. The cap layer 320a formed on the bit line 322 and the spacer 324 formed on the sidewall of the bit line 322 can protect the bit line 322 and the gate 303 from being etched. Because the etching rates of the cap layer 320a, the spacer 324, and the dielectric layers 328a and 326a are different, the cap layer 320a and the spacer 324 can prevent the bit line 322 and the gate 303 from being etched when misalignment occurs in the photolithography process.

In FIG. 3G, the stacked layer 332a, the conductive layer 342a, and the conductive spacer 348 are used as masks to etch a portion of the dielectric layer 312a leaving a dielectric layer 312b. A contact node opening 350 exposing the source/drain region 305 is formed through the dielectric layer 312b. A conductive layer 352 is formed over the substrate 300 and fill into the contact node opening 350 to form a contact node electrically coupled with the source/drain region 305. Because the etching rates of the conductive layer 342a and the conductive spacer 348 are different from the etching rate of the dielectric layer 312a, the conductive layer 342a and the conductive spacer 348 are used as masks when performing an etching step. The conductive layer 352 includes a doped polysilicon layer formed by chemical vapor deposition, for example.

Figure 4B:
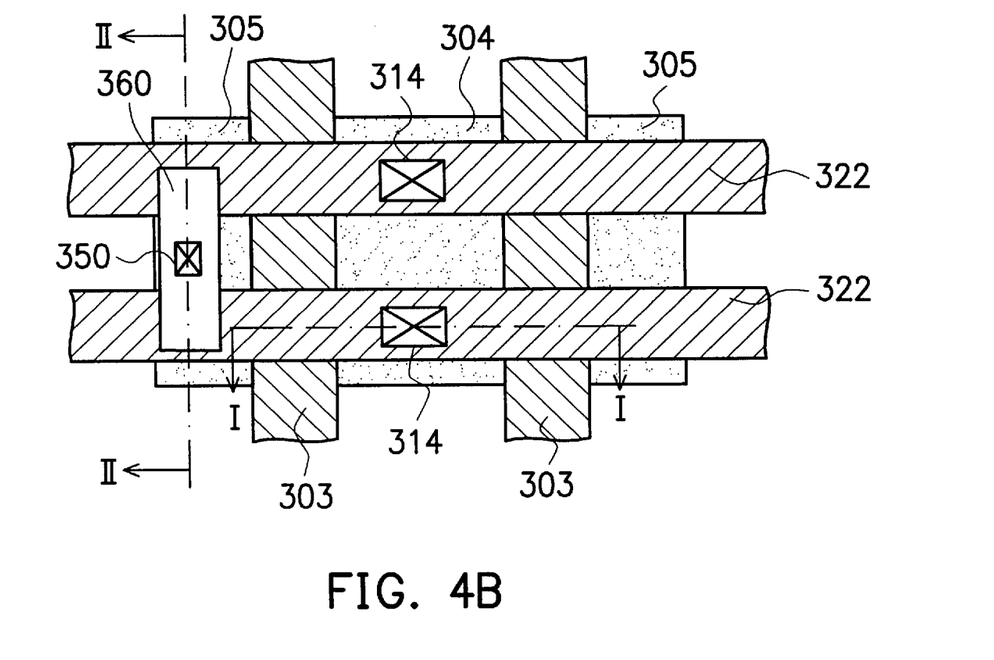
FIG. 4B is a top-view showing a DRAM layout of the FIGS. 3E through 3H.

In FIG. 3H, the etching stop layer 330a is used as an etching stop point to pattern the conductive layer 352 and the stacked layer 322a. The etching stop layer 330a is used as an etching mask to removed the isolation layers 336a and 340a of the stacked layer 332a. A conductive layer 352a and conductive layers 334a, 338b, and 342a remain. A storage node defined by the conductive layer 334b, 338b, and 342b and the spacer 350 are formed. A dielectric film layer 354 and a conductive layer 356 are formed over the substrate 300. The capacitor 360 is formed. The conventional method of removing the isolation layers 336, and 340 of silicon oxide includes using the etching stop layer 330 of silicon nitride. An isotropic method is performed by using the dilute HF liquid to remove the isolation layer 336 and 340. The dielectric film layer 354 can be, for example, a silicon oxide layer, a silicon nitride/silicon oxide (NO) layer, a silicon oxide/silicon nitride/silicon oxide (ONO) layer, a $Ta_2O_5$ layer, a $Pb(Zr, Ti)O_3$ layer (PZT layer), a $(Ba, Sr)TiO_3$ layer (BST layer), or other layer with a high dielectric constant. The conductive layer 356 can be, for example, a doped polysilicon layer formed by simultaneous chemical vapor deposition and doping. The dopant includes As ions of an N-type FIG. 4B is a top-view showing a DRAM layout of FIGS. 3E through 3H. FIGS. 3A through 3D are schematic, cross-sectional views of FIG. 4 taken along line I—I'. FIGS. 3A through 3H are schematic, cross-sectional views of FIG. 4 taken along line II—II'. The self-aligned contact hole 314 is located between the gates 303. The self-aligned contact hole 334 between the bit lines 303 is used to electrically couple the capacitor 360 with the source/drain region 305.

In summary, the advantages of the present invention include:

1. In the present invention, the cap layer and the spacer are formed on the gate to protect gate from etching. A self-aligned contact hole is formed at first and then the self-aligned contact hole is etched again to form a contact node opening. In this way, the difficulty of forming the contact node opening can be reduced.

2. In the present invention of forming the DRAM capacitor, the storage ability of the capacitor is increased by the increasing effective area of the capacitor.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor, comprising the steps of:

forming a transistor having a first source/drain region and a second source/drain region on the substrate;

forming a first dielectric layer on the substrate;

forming a bit line having a cap layer thereon on the first dielectric layer and electrically coupled with the first source/drain region;

forming a spacer on a sidewall of the bit line;

forming a second dielectric layer, an etching stop layer, and a stacked layer over the substrate, wherein the stacked layer is formed at least from a first conductive layer, a first isolation layer, and a second conductive layer separated from the first conductive layer by the first isolation layer;

patterning the stacked layer, the etching stop layer and the second dielectric layer to form a self-aligned contact hole over the second source drain region;

forming a conductive spacer on a sidewall of the stacked layer, the etching stop layer, and the second dielectric layer exposed by the self-aligned contact hole;

using the second conductive layer and the conductive spacer as masks and removing the first dielectric layer to form a contact node opening exposing the second source/drain region;

forming a third conductive layer on the substrate to fill the contact node opening and electrically couple with the second source/drain region;

using the etching stop layer as the etching stop point and patterning the third conductive layer and the stacked layer;

using the etching stop layer as the etching mask and removing the first isolation layer of the stacked layer to form a storage electrode defined by the third conductive layer, the second conductive layer, and the first conductive layer;

forming a dielectric film layer on the third conductive layer, the second conductive layer, and the first conductive layer; and forming a fourth conductive layer over the substrate to form a cell electrode.

2. The method of claim 1, wherein the step of forming the bit line having the cap layer thereon comprises forming and patterning a fifth conductive layer and a second isolation layer over the substrate.

3. The method of claim 2, wherein the material of the fifth conductive layer comprises doped polysilicon.

4. The method of claim 2, wherein the material of the fifth conductive layer comprises silicide.

5. The method of claim 1, wherein the etching rates of the cap layer and the spacer are different from the etching rate of the first dielectric layer.

6. The method of claim 5, wherein the material of the spacer comprises a silicon-rich oxide.

7. The method of claim 2, wherein the material of the second isolation layer comprises a silicon-rich oxide.

8. The method of claim 1, wherein the etching rates of the etching stop layer and the first isolation layer are different.

9. The method of claim 8, wherein the material of the etching stop layer comprises a silicon nitride and the material of the first isolation layer comprises silicon oxide.

10. The method of claim 1, wherein the material of the first, the second, the third, and the fourth conductive layers comprise doped polysilicon.

11. The method of claim 1, wherein the etching rates of the first isolation layer, the first conductive layer, and the second conductive layer are different.

12. The method of claim 1, wherein the step of forming the conductive spacer comprises:

forming a sixth conductive layer over the substrate; and etching the sixth conductive layer.

13. The method of claim 12, wherein the material of the sixth conductive layer comprises doped polysilicon.

14. The method of claim 1, wherein the material of the conductive spacer comprises doped polysilicon.

15. The method of claim 1, wherein the step of removing the first dielectric layer to form a contact node opening comprises anisotropic etching.

16. The method of claim 1, wherein the step of removing the first dielectric layer to form a contact node opening comprises isotropic etching.

17. The method of claim 14, wherein the step of removing the first dielectric layer to form a contact node opening comprises wet etching.

18. The method of claim 1, wherein the dielectric film layer comprises a silicon nitride/silicon oxide (NO) layer.

19. The method of claim 1, wherein the dielectric film layer comprises a silicon oxide/silicon nitride/silicon oxide (ONO) layer.

20. The method of claim 1, wherein the dielectric film layer comprises a $Ta_2O_5$ layer.

21. The method of claim 1, wherein the dielectric film layer comprises a PZT layer.

22. The method of claim 1, wherein the dielectric film layer comprises a BST layer.

23. The method of claim 1, further comprising forming a seventh conductive layer and a third isolation layer between the first isolation layer and the second conductive layer, wherein the step of removing the first isolation layer and the second conductive layer further comprises removing the third isolation layer to expose the storage electrode formed by the third conductive layer, the stacked layer, the first, the second, and the seventh conductive layers.

* * * * *